United States Patent [19]
Lim

[11] Patent Number: 5,544,271
[45] Date of Patent: Aug. 6, 1996

[54] NONLINEAR OPTICAL GENERATOR WITH INDEX OF REFRACTION PERTURBED REFLECTOR ARRANGEMENT

[75] Inventor: Eric J. Lim, Sunnyvale, Calif.

[73] Assignee: Uniphase Corporation, San Jose, Calif.

[21] Appl. No.: 354,316

[22] Filed: Dec. 12, 1994

[51] Int. Cl.$^6$ ........................................... G02F 1/37
[52] U.S. Cl. ................. 385/122; 359/328; 359/332; 372/22
[58] Field of Search ............... 385/122; 372/21–22; 359/326–332

[56] References Cited

U.S. PATENT DOCUMENTS

| | | | |
|---|---|---|---|
| 4,913,507 | 4/1990 | Stamnitz et al. | 359/332 X |
| 5,036,220 | 7/1991 | Byer et al. | 307/427 |
| 5,128,948 | 7/1992 | Papuchon et al. | 372/21 |
| 5,170,460 | 12/1992 | Arvidsson et al. | 385/129 |
| 5,247,528 | 9/1993 | Shinozaki et al. | 372/22 |
| 5,253,259 | 10/1993 | Yamamoto et al. | 372/22 |

OTHER PUBLICATIONS

Andrew Corporation, "Polarization Maintaining Optical Fibers", Bulletin 1295E, 1992, 4 pages (no month).
Erdogan, T., et al., "Fiber Grating Technology Grows", IEEE LEOS Newsletter, Feb. 1993, pp. 14–18.
Giles, C. R., et al., "Reflection–Induced Changes in the Optical Spectra of 980–nm QW Lasers", IEEE Photonics Technology Letters, vol. 6, No. 8, Aug. 1994, pp. 903–906.
Giles, C. R., et al., "Simultaneous Wavelength–Stabilization of 980–nm Pump Lasers", IEEE Photonics Technology Letters, vol. 6, No. 8, Aug. 1994, pp. 907–909.
Hill, K. O., et al., "Photosensitivity in Optical Fibers", Annu. Rev. Mater. Sci. 1993, vol. 23, pp. 125–157. (no month).
Hill, K. O., et al., "Bragg gratings fabricated in monomode photosensitive optical fiber by UV exposure through a phase mask", Appl. Phys. Lett., vol. 62, No. 10, 8 Mar. 1993, pp. 1035–1037.
Meltz, G., et al., "Formation of Bragg gratings in optical fibers by a transverse holographic method", Optics Letters, vol. 14, No. 15, Aug. 1, 1989, pp. 823–825.
Morey, W. W., et al., "Photoinduced Bragg Gratings in Optical Fibers", Optics & Photonics News, Feb. 1994, pp. 8–14.
Morton, P. A., et al., "Stable single mode hybrid laser with high power and narrow linewidth", Appl. Phys. Lett., vol. 64, No. 20, 16 May 1994, pp. 2634–2636.
Risk, W. P., et al., "Generation of 425–nm light by waveguide frequency doubling of a GaAlAs laser diode in an extended–cavity configuration", Appl. Phys. Lett., vol. 63, No. 23, 6 Dec. 1993, pp. 3134–3136.
Risk, W. P., et al., "Third–Order Guided–Wave Distributed Bragg Reflectors Fabricated by Ion–Exchange in KTiOPO$_4$", IEEE Photonics Technology Letters, vol. 6, No. 3, Mar. 1994, pp. 406–408.
Woodward, S. L., et al., "Wavelength Stabilization of a DBR Laser Using an In–Fiber Bragg Filter", IEEE Photonics Technology Letters, vol. 5, No. 6, Jun. 1993, pp. 628–630.

*Primary Examiner*—John D. Lee
*Attorney, Agent, or Firm*—Flehr, Hohbach, Test, Albritton & Herbert

[57] ABSTRACT

A nonlinear optical generator which includes an optical fiber is described. The optical fiber has perturbations in the effective index of a mode guided by the same. These perturbations are simply provided as a multitude of transitions between the indices of refraction of the fiber, spaced along the path of radiation within the same.

21 Claims, 1 Drawing Sheet

NONLINEAR OPTICAL GENERATOR WITH INDEX OF REFRACTION PERTURBED REFLECTOR ARRANGEMENT

BACKGROUND OF THE INVENTION

The present invention relates to nonlinear optical frequency generators and, more particularly, to such a generator having an improved source for pumping radiation. Small, compact sources of optical radiation are desired for many purposes. For example, it is desired to have a compact source of "blue" light for use with certain biomedical instrumentation. It is also desirable to have "green" light for use with optical storage devices. Both blue and green light are referred to as forms of optical radiation—radiation having a frequency of a value falling within the typical frequency ranges referred to as the near infrared, the visible, and the ultraviolet ranges, i.e., radiation having a frequency of between about 0.2 µm and 5 µm.

One way of obtaining optical radiation of a desired frequency is to convert other radiation such as that of one or more frequencies issuing from a diode laser to the desired radiation. An example is the frequency "doubling" of a selected frequency by a nonlinear generator of a type referred to typically as a second harmonic generator (SHG). Reference is made to U.S. Pat. No. 5,036,220 naming applicant, among others, for an earlier invention in this field to which applicant made significant contribution.

One of the problems associated with this approach is that for efficient conversion it is desirable that the radiation issuing from the source diode laser be within highly prescribed frequency limits. One way to only obtain a selected frequency for the pump radiation (the diode radiation) is to provide a reflector which is made up of indices of refraction transitions selected to confine the source radiation output to the selected frequency. This is known. However, the approaches to obtaining it in the past have problems. Reference is made, for example, to Shinozaki et al. U.S. Pat. No. 5,247,528 which describes a nonlinear optical generator which utilizes quasi-phasematching to provide output radiation having the second harmonic wavelength of the incoming pump or, in other words, fundamental radiation. Shinozaki et al. teaches selecting periodic reversals of the spontaneous polarization for quasi-phasematching so that they will also provide desired transitions in the indices of refraction. Thus, Shinozaki et al. is constrained to the selection of transitions which will provide both functions. This constraint makes simultaneous optimization of frequency doubling and distributed transitions difficult.

Another approach is that described in Welch et al. U.S. Pat. No. 5,185,752. Welch provides periodic perturbations to select the wavelength of the frequency which is doubled. He does so by etching the exposed portions of the top surface of the waveguide in the nonlinear material. This etching process is separate from the processes used to make the nonlinear waveguide and thus adds complexity to the fabrication of the device. Additionally, once the perturbations are etched into the waveguide material, they are permanent and a wrong selection cannot be corrected by reworking.

It should be noted that both of the above approaches involve a periodic variation in the effective index of a guided mode.

SUMMARY OF THE INVENTION

The present invention relates to a nonlinear optical frequency generator having a multitude of transitions of the effective index of a guided mode, and yet not having the problems mentioned above. In general terms, the invention includes the combination in one unit of a source of radiation, a nonlinear material and an optical fiber (a type of waveguide) positioned to receive the radiation from the source and provide the multitude of transitions of the effective index of a guided mode.

Most desirably, the multitude of transitions in the effective index of a guided mode are provided by perturbations in the indices of refraction of the fiber along the path therein of the source radiation. Moreover, the nonlinear material preferably is a ferroelectric one having spontaneous polarization, and the frequency interaction in the material is obtained by quasi-phasematching. Quasi-phasematching allows one to use a nonlinear material that cannot be birefringently phase-matched. The generator is also most simply a second harmonic generator, and a channel waveguide for the interacting radiation frequencies is defined in the nonlinear material. A second harmonic is the strongest harmonic, and the use of a channel waveguide increases the single pass conversion efficiency. The invention also includes a method of making the generator, as well as a method of producing radiation of a desired frequency.

Other features and advantages of the invention either will become apparent or will be described in connection with the following, more detailed description of preferred embodiments of the invention.

BRIEF DESCRIPTION OF THE DRAWING

With reference to the enclosed single sheet of drawings.

DETAILED DESCRIPTION OF THE PREFERRED EMBODIMENTS

The following relatively detailed description is provided to satisfy the patent statutes. It will be appreciated by those skilled in the art, though, that various changes and modifications can be made without departing from the invention.

Figure 1:
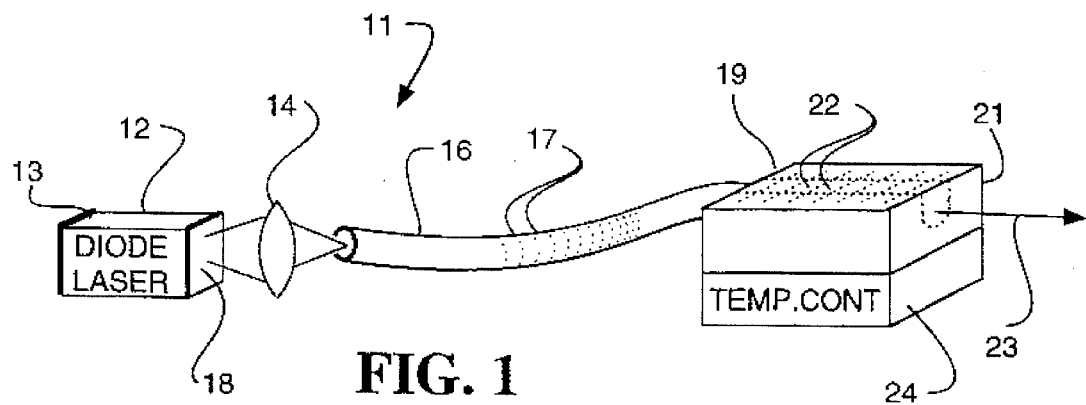
FIG. 1 is an isometric and schematic illustration of a first preferred embodiment of the invention.

A nonlinear optical generator of the invention is generally indicated in FIG. 1 by the reference numeral 11. Such generator includes a source of pumping radiation represented at 12. This source most simply is furnished as a diode laser of the Fabry-Perot type. The gain medium can be, for example, AlGaInP, GaAlAs, GaAs, InGaAs, or InGaAsP if optical gain in the wavelength region of 670–1550 nm is desired. A typical example is the Model SDL-AR-5410 diode laser which is commercially available from Spectra Diode Laboratories, Inc., San Jose, Calif.

It is unimportant that the source 12 actually be a laser—only a gain medium and one reflector (which, of course, can be a facet of the gain medium) is needed for the invention. In this connection, one of the facets of diode laser 12, the facet which is to act as a reflector, includes a high reflective coating 13.

The diode laser is chosen so that radiation emanating from it includes radiation having the selected pumping frequency. This radiation will be focused as is represented by focusing lens 14 onto the entry end of a single (lowest order) transverse mode, polarization preserving, optical fiber 16.

(Beam shaping or polarization rotation optics also could be provided between the diode laser and the fiber.) The fiber 16 most desirably has an elliptical core for better mode matching. It includes a reflector location along its length, defined by a multitude of transitions between differing indices of refraction. The dotted lines 17 represent the transitions, although it will be recognized that such transitions are not actually visible.

The radiation produced by the gain medium of the diode laser has a multitude of actual or potential frequencies, including a frequency to be selected for pumping. The value of the indices of refraction and the spacings between the transitions 17 are chosen to segregate the selected pumping frequency from all of the others. (The production of such transitions in optical fibers is not new. It can be done, for example, by interference of ultraviolet radiation.) This grating (spaced transitions) functions as a wavelength-selective mirror and acts with the high reflective coating 13 on the far end of the diode laser 12 to define a lasant optical cavity. Because of the frequency selective grating provided by the transitions 17, only the selected frequency will lase. The reflectivity of the grating is chosen to maximize the output power, i.e., to maximize the output power of the selected pumping frequency. The selection of the indices of refraction and the spacing between transitions is, of course, dependent upon the selected frequency and the range of frequencies from which it is to be selected. It is defined mathematically as follows:

$$\lambda = 2n_{eff}\Lambda$$

where a grating of period $\Lambda$ provides reflection of a guided mode with effective index $n_{eff}$ at the wavelength $\lambda$.

The optimum reflectivity is a function of the single-pass gain of the laser gain medium, the efficiency with which light is coupled from the gain medium into the fiber, and optical losses in the laser cavity. These optical losses will include, of course, the transmission losses in the fiber and the absorption losses at the reflector.

The material from which the optical fiber 16 is made must be selected to be one which can transmit the desired radiation frequencies. In one second harmonic generator implementation of the invention in which it was desired to frequency double 980 nm radiation, such material was germanium doped silica glass. An appropriate fiber is the E-Series single mode, polarization maintaining fiber (part No. 48280, 1060S-1) of the Andrew Corporation of Orland Park, Ill. It meets all of the characteristics listed above.

As mentioned previously, the diode laser as furnished in the generator of the invention does not necessarily act as a laser itself. In this connection, the front facet of the diode laser is provided with an anti-reflective coating 18 to reduce or eliminate the internal lasing one typically expects from a diode laser. The source is therefore a "modified" diode laser, which source includes the optical cavity defined within the fiber 16. Some in the field look at this phenomenon simply as "feedback" to the diode laser from the grating defined by the transitions 17. A laser of this type also has been referred to as a "hybrid" laser (See the Morton et al. paper entitled "Stable single mode hybrid laser with high power and narrow line width" appearing in *Applied Physics Letters* 64, pages 2634 et seq. (May 16, 1994)). However, there may be some internal reflection at the facet having the coating 18, with the result that there will be multiple cavities formed by the diode laser facets and the frequency selective grating.

Most desirably, the reflector is "chirped" with the spacing between transitions being reduced in the direction away from the diode laser. It is believed that this arrangement results in more stable operation of the laser. What is important, though, is that the distributed reflector defined by the transitions 17 act to select the desired pumping frequency from the other frequencies which might emanate from the lasing media.

The selected frequency is conveyed by the fiber 17 to the entry end of a channel waveguide 19 within a nonlinear material. There are many different nonlinear materials. Some are: $LiNbO_3$, $LiTaO_3$, $KTiOPO_4$, $KNbO_3$, $BaB_2O_4$, $LiB_3O_5$, GaAs and AlGaAs. A ferroelectric one preferably is selected and periodic reversals in the directions of spontaneous polarization are provided along the length of the waveguide. As is indicated by applicant's earlier patent, such an arrangement is quite effective for quasi-phasematching to convert the frequency of pump radiation to a desired frequency. The walls between the sections of differing spontaneous polarization are represented in the figure by dotted lines 22.

Output radiation having the desired frequency emanates from the waveguide 19. This output is represented in the figures by the arrow 23. When "blue" light is desired, the nonlinear material may be $LiNbO_3$, $LiTaO_3$, or $KTiOPO_4$. The conversion efficiency to the desired output frequency can be maximized by finely tuning the temperature of the waveguide 19. Such temperature variation can be achieved by placing the nonlinear material in an oven or by having it in thermal contact with a thermoelectric cooler, as appropriate. The box 24 in thermal contact with the nonlinear material represents such temperature control. The temperature of the fiber transitions can be varied to change the frequency of the pumping radiation, thereby also changing the frequency of the output radiation.

Figure 2:
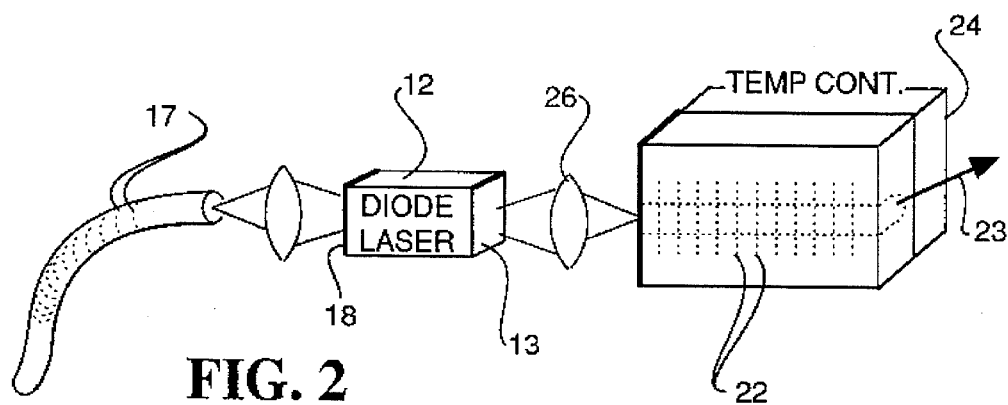
FIG. 2 is a view that is similar to FIG. 1, showing another embodiment of the invention.

It is not necessary that the fiber have a dual purpose, i.e., deliver the pumping radiation to the waveguide as well as provide a frequency selective reflector for the hybrid laser. FIG. 2 illustrates such an arrangement in which it does not deliver the pump radiation to the waveguide. With reference to such figure, it is seen that the highly reflective coating 13 is provided on the front facet of the diode laser 12, whereas the antireflection coating is provided on the facet of the diode laser closest to the optical fiber. In this arrangement the hybrid laser is defined between the facet 13 and the reflector defined by the transitions 17. The diode high reflection coating 13 is selected to permit some transmission of the selected frequency for transmission to the waveguide. In this connection, a second focusing lens 26 is provided to focus the selected radiation into the channel waveguide 19 for quasi-phasematching production of radiation of the desired frequency.

It will be seen that except for the focusing lens 26, the embodiment of FIG. 2 broadly has the same parts as the earlier described embodiment, and like reference numerals are used to represent like elements.

Figure 3:
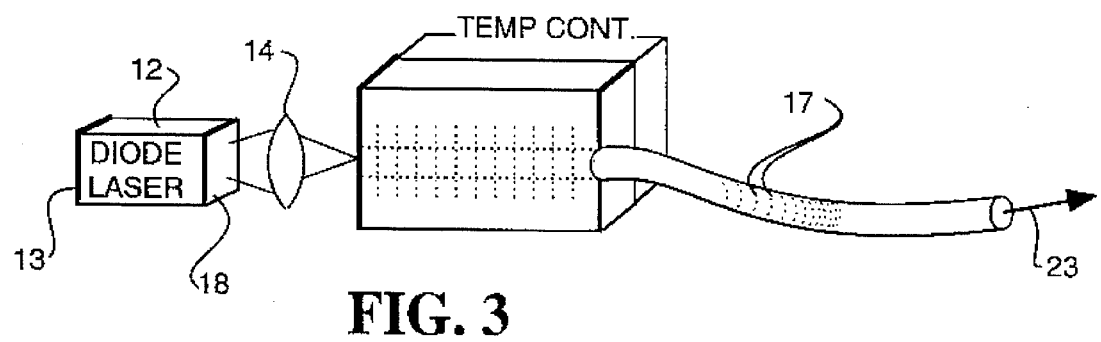
FIG. 3 is also a view similar to FIG. 1, showing yet a third embodiment of the invention.

Both of the embodiments discussed above are ones in which the nonlinear material is outside the hybrid laser cavity. This also is not necessary from the broad standpoint. FIG. 3 illustrates an arrangement in which the channel waveguide 19 is positioned between the diode laser 12 and the fiber 17. Focusing lens 14 focuses the output of the diode laser into the nonlinear material rather than into the end of the fiber. In this connection, it must be remembered that in general this output will only be made up of the selected pumping frequency—the other actual and projected frequencies will be segregated from the same by the reflector defined by the transition 17 so as not to lase. The output radiation will emanate from the end of the optical fiber 23.

The above arrangement provides intracavity frequency conversion. The nonlinear material receives more power at a selected wavelength than it would if placed outside the laser cavity. This greater power improves the nonlinear conversion efficiency.

As mentioned at the beginning of the detailed description, applicant is not limited to the specific embodiments described above. Various changes and modifications can be made. The claims, their equivalents and their equivalent language define the scope of protection.

What is claimed is:

1. A nonlinear optical generator for producing output radiation having a desired frequency, said nonlinear optical generator comprising:

(a) a source of radiation having one or more actual or potential frequencies including a selected frequency that can interact with a nonlinear optical material to produce therefrom, output radiation having said desired frequency;

(b) a nonlinear material for receiving radiation from said source and producing at least partly therefrom, said output radiation having said desired frequency; and (c) an optical fiber positioned to receive radiation from said source, which fiber includes a multitude of transitions in the effective index of a mode guided by said fiber, said transitions being chosen to cause said source to provide radiation having said selected frequency, and wherein said nonlinear material is outside a laser cavity which includes both said source of radiation and at least part of said optical fiber.

2. A nonlinear optical generator according to claim 1 wherein said multitude of transitions in the effective index of a guided mode in said fiber are caused by a multitude of transitions between indices of refraction spaced along the path of source radiation therein.

3. A nonlinear optical generator according to claim 1 wherein the selected source radiation generally has half the frequency of the desired output radiation, and said nonlinear material is selected to produce as said output radiation, the second harmonic of said source radiation.

4. A nonlinear optical generator according to claim 1 wherein said optical fiber is chosen to be polarization preserving and to support a single transverse mode of the selected radiation received from said source.

5. A nonlinear optical generator according to claim 1 wherein said nonlinear material includes a channel waveguide for receiving said radiation from said source.

6. A nonlinear optical generator according to claim 1 wherein said nonlinear material has sections of alternating spontaneous polarization to enable said output radiation to be provided via quasi-phasematching.

7. A nonlinear optical generator according to claim 1 wherein said fiber is positioned to transmit said selected frequency to said nonlinear material.

8. A nonlinear optical generator according to claim 1 wherein the periodicity of said transitions in said fiber varies along the path of source radiation in said fiber.

9. A nonlinear optical generator according to claim 8 wherein said periodicity of said transitions is reduced in space in the direction from which radiation from said source traverses the same.

10. A nonlinear optical generator according to claim 1 wherein said source is a semiconductor diode laser having a front facet which is provided with an anti-reflective coating suitable to reduce or eliminate internal lasing such that an optical cavity is defined to include said semiconductor diode laser and at least part of said optical fiber.

11. A nonlinear optical generator according to claim 10 wherein said nonlinear material is selected from the group consisting of $LiNbO_3$, $LiTaO_3$, and $KTiOPO_4$.

12. A nonlinear optical generator for producing output radiation having a desired frequency, said nonlinear optical generator comprising:

(a) a source of radiation having one or more actual or potential frequencies including a selected frequency that can interact with a nonlinear optical material to produce therefrom, output radiation having said desired frequency;

(b) a nonlinear material for receiving radiation from said source and producing at least partly therefrom, said output radiation having said desired frequency; and (c) an optical fiber positioned to receive radiation from said source, which fiber includes a multitude of transitions in the effective index of a mode guided by said fiber, said transitions being chosen to cause said source to provide radiation having said selected frequency, and wherein said nonlinear material is positioned between said source and said transitions in said optical fiber.

13. A nonlinear optical generator according to claim 12 wherein said multitude of transitions in the effective index of a guided mode in said fiber are caused by a multitude of transitions between indices of refraction spaced along the path of source radiation therein.

14. A nonlinear optical generator according to claim 12 wherein the selected source radiation generally has half the frequency of the desired output radiation, and said nonlinear material is selected to produce as said output radiation, the second harmonic of said source radiation.

15. A nonlinear optical generator according to claim 12 wherein said optical fiber is chosen to be polarization preserving and to support a single transverse mode of the selected radiation received from said source.

16. A nonlinear optical generator according to claim 12 wherein said nonlinear material includes a channel waveguide for receiving said radiation from said source.

17. A nonlinear optical generator according to claim 12 wherein said nonlinear material has sections of alternating spontaneous polarization to enable said output radiation to be provided via quasi-phasematching.

18. A nonlinear optical generator according to claim 12 wherein the periodicity of said transitions in said fiber varies along the path of source radiation in said fiber.

19. A nonlinear optical generator according to claim 18 wherein said periodicity of said transitions is reduced in space in the direction from which radiation from said source traverses the same.

20. A nonlinear optical generator according to claim 12 wherein said source is a semiconductor diode laser having a front facet which is provided with an anti-reflective coating suitable to reduce or eliminate internal lasing such that an optical cavity is defined to include said semiconductor diode laser and at least part of said optical fiber.

21. A nonlinear optical generator according to claim 20 wherein said nonlinear material is selected from the group consisting of $LiNbO_3$, $LiTaO_3$, and $KTiOPO_4$.

* * * * *